(12) United States Patent
McLeod (10) Patent No.: US 8,058,929 B1
(45) Date of Patent: Nov. 15, 2011

(54) MAINTAINING LOOP LINEARITY IN PRESENCE OF THRESHOLD ADJUSTMENT

(75) Inventor: Scott McLeod, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/777,027

(22) Filed: May 10, 2010

(51) Int. Cl.
  *H03F 3/45* (2006.01)
(52) U.S. Cl. .................. 330/259; 330/290; 327/307
(58) Field of Classification Search .......... 330/252–261, 330/85, 290; 327/307–308
  See application file for complete search history.

(56) References Cited

U.S. PATENT DOCUMENTS

| 7,098,716 | B2 * | 8/2006 | Ono | 327/307 |
| 7,551,023 | B2 * | 6/2009 | Ebner | 330/85 |
| 7,782,137 | B2 * | 8/2010 | Tanaka | 330/259 |
| 2008/0157847 | A1 | 7/2008 | Liu | |

FOREIGN PATENT DOCUMENTS

EP  0 736 968 A2  10/1996

OTHER PUBLICATIONS

International Search Report and Written Opinion for PCT/US2011/027634, Jun. 22, 2011.

Maxim, A. et al., "A Low Power 12.5Gb/s SiGe Limiting Amplifier Using a Feed-forward Adjustable Threshold Loss-Of-Signal Detector," *IEEE BIPOLAR/BICMOS Circuits and Technology Meeting*, Oct. 1, 2006.

Maxim A: "A 54 dB + 42 dB 10 Gb/s SiGe Transimpedance-Limiting Amplifier Using Bootstrap Photodiode Capacitance Neutralization and Vertical Threshold Adjustment," *IEEE Journal of Solid-State Circuits*, 42(9), Sep. 1, 2007.

* cited by examiner

*Primary Examiner* — Hieu P Nguyen
(74) *Attorney, Agent, or Firm* — Baker Botts L.L.P.

(57) ABSTRACT

In one embodiment, a method includes receiving, at a filter comprising a Miller amplifier, a differential data signal output by a limiting amplifier (LA), the data signal comprising an output direct current (DC) offset resulting at least in part from a threshold-adjustment signal applied to the LA or an intrinsic DC offset caused by physical characteristics of the LA. In one embodiment, the method additionally includes generating a compensation signal based on the threshold-adjustment signal, a polarity of the compensation signal being opposite a polarity of the threshold-adjustment signal or the DC offset, a magnitude of the compensation signal being a function of the magnitude of the threshold-adjustment signal. In one embodiment, the method further includes introducing the compensation signal to an internal node of the Miller amplifier to compensate for the DC offset to keep one or more amplifier stages of the Miller amplifier in their linear operating regions.

20 Claims, 6 Drawing Sheets

MAINTAINING LOOP LINEARITY IN PRESENCE OF THRESHOLD ADJUSTMENT

TECHNICAL FIELD

This disclosure relates generally to cancelling or compensating for direct current (DC) offset in amplifying circuits.

BACKGROUND

In an integrated limiting amplifier (LA), a large resistance/capacitance (RC) low-pass filter is typically utilized to sense and extract the LA's direct current (DC) offset. The DC offset may have one or more contributions including an intrinsic DC offset that arises due to mismatches in the dimensions or doping characteristics of the LA's constituent transistors, among other possibilities. The output of the filter—the DC offset—is fed back to the LA's input stage in negative feedback to cancel or compensate for the DC offset. Typically, industry specifications dictate that the time constant of the filter be very large (e.g., in the tens of kilohertz (kHz)) such that the low-frequency cutoff of the LA is sufficiently low so that the LA can tolerate long strings of consecutive identical digits (CIDs) without introducing baseline wander (also referred to as "DC drift") into the LA output signal. Consequently, the filter capacitance (C) must be large, often in the microfarad range. Achieving such a large capacitance on-chip would require a very large chip (e.g., silicon chip) area. Such a required area is expensive and often unfeasible.

Thus, to produce the large required capacitance in a smaller and achievable silicon chip area, the filter's capacitor is often enclosed in a negative feedback loop to increase the effective capacitance of the filter, a well-known technique referred to as the Miller effect. The feedback loop, also referred to as the "Miller loop," generally comprises one or more voltage amplifiers (referred to collectively as the "Miller amplifier"). Specifically, using the Miller amplifier, the capacitance of the filter may be increased by a factor of $1+A_V$, where $A_V$ is the total voltage gain of the Miller amplifier. The amplifiers of the Miller loop (i.e., the Miller amplifier) should remain in their linear operating regions in order to realize the desired capacitance amplification. If the amplifiers become non-linear, the gain $A_V$ decreases, and consequently so too does the amplified capacitance of the filter.

DESCRIPTION OF EXAMPLE EMBODIMENTS

Particular embodiments relate to an electronic circuit, device, system, or method for maintaining loop linearity in a low-pass filter used in an integrated limiting amplifier (LA) circuit in the presence of an intrinsic DC offset in the LA circuit or a DC offset resulting from a threshold adjustment (also known as a "slice-level" adjustment) in the LA circuit. Particular embodiments relate to a low-pass filter in an LA circuit that includes a Miller amplifier (or "Miller loop") to amplify the capacitance of the low-pass filter. In particular embodiments, a current of opposite polarity as an applied threshold-adjustment current is injected into an internal node of the Miller loop to maintain linearity in the Miller loop. In particular embodiments, the magnitude of the current injected into the Miller loop is a statically-predetermined or dynamically-determined fraction of the magnitude of the threshold-adjustment current. In particular embodiments, the capacitance amplification by the Miller loop is maintained irrespective of the magnitude of the DC offset in the LA circuit. In particular embodiments, by maintaining the loop linearity, and thus the capacitance amplification in the low-pass filter, the low-frequency cutoff specification of the LA circuit is ensured to be met across operating conditions regardless of the intrinsic DC offset or threshold adjustment.

Particular embodiments relate to an LA circuit within a deserializer utilized in optical communication. However, alternative embodiments may be utilized in other specific applications and for non-optical communication (e.g., hard-wired communication using electrons), where appropriate. Particular embodiments may be utilized in high-speed communication systems (e.g., data bit rates greater than 10 Gigabits per second (Gb/s)) and in even more particular embodiments, in communication system having data rates at or exceeding 20 Gb/s or 40 Gb/s. Additionally, as used herein, "or" may imply "and" as well as "or;" that is, "or" does not necessarily preclude "and," unless explicitly stated or implicitly implied.

Figure 1:
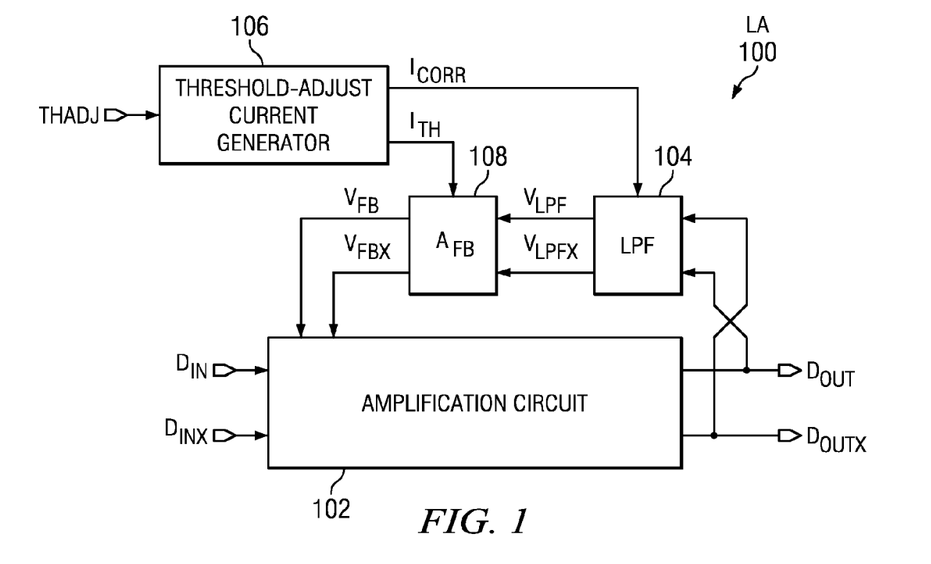
FIG. 1 illustrates an example limiting amplifier circuit.

FIG. 1 illustrates an example LA circuit architecture 100 ("LA 100") that includes an amplification circuit 102, a low-pass filter circuit 104 ("LPF 104"), a threshold-adjust current generator 106, and a feedback amplifier circuit ("$A_{FB}$") 108. In one example embodiment, LA 100 is configured to process data streams having data rates of 20 Gb/s. In particular embodiments, LA 100 receives a differential input data signal from a transimpedance amplifier. In particular embodiments, the differential input data signal has a data rate of approximately 20 Gb/s and comprises a first input data signal (stream) component $D_{IN}$ and a second input data signal (stream) component $D_{INX}$ (where $D_{INX}$ is the complement of $D_{IN}$). In particular embodiments, LA 100 outputs a differential output data signal that has the same data rate as the input data signal and that comprises a first output data signal (stream) component $D_{OUT}$ and a second output data signal (stream) component $D_{OUTX}$ (where $D_{OUTX}$ is the complement of $D_{OUT}$).

In particular embodiments, threshold-adjust current generator 106 is configured to receive a threshold-adjustment input signal THADJ (or as will be described below, a signal based on the threshold-adjust input signal) that threshold-adjust current generator 106 uses to determine and output a threshold-adjustment (or "slice-adjustment") output signal $I_{TH}$ that is then fed to $A_{FB}$ 108. $A_{FB}$ 108 then generates differential feedback voltage signal $V_{FB}$ and $V_{FBX}$ (where $V_{FBX}$ is the complement of $V_{FB}$) which are then fed to amplification circuit 102 to adjust the slice level of LA 100.

In particular embodiments, LPF 104 comprises a resistor, a capacitor, and a feedback loop that is enclosed around the capacitor, which is typically known as a Miller loop. The Miller loop is referred to as such as it utilizes feedback (the Miller effect) to amplify the effective capacitance of the LPF 104. As described above, to produce the large required capacitance in a smaller and achievable silicon or other chip area, a Miller loop is utilized in LPF 104 to increase by virtue of feedback the effective capacitance of the LPF 104. Specifically, using the Miller loop, the capacitance of LPF 104 may be increased by a factor of $1+A_V$, where $A_V$ is the total gain of the one or more amplifiers that comprise the Miller loop (referred to collectively as the "Miller amplifier"). The feedback loop around the Miller amplifier should remain linear in order to realize the desired capacitance amplification. If the loop becomes non-linear, the gain $A_V$ decreases, and consequently, so too does the amplified capacitance of LPF 104.

Figure 2:
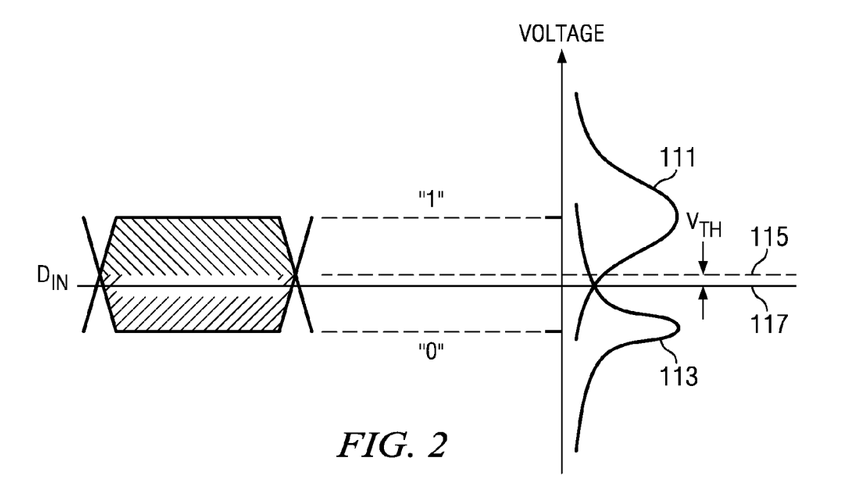
FIG. 2 illustrates a signal with unequal noise distributions requiring a threshold adjustment.

By way of background, LAs that operate in optical receivers typically include a mechanism that controls the threshold (or "slice") level of the LA; that is, the decision voltage at which a data signal is determined to be a logical "1" or logical "0." The threshold level may be adjusted based on a threshold-adjustment signal to introduce an artificial offset into the LA. By way of example, if the input signal $D_{IN}$ to LA 100 is significantly distorted (e.g., the signal has unequal noise distributions), as illustrated in FIG. 2, a potentially large threshold adjustment $V_{TH}$ is required to produce the optimal signal at the output of the LA. In FIG. 2, curve 111 indicates the noise distribution for bits having logical "1" values, curve 113 indicates the noise distribution for bits having logical "0" values, line 115 indicates the default slicing threshold (i.e., midway between the logical "0" and logical "1" values), and line 117 indicates the optimal slicing threshold achieved with threshold adjustment. However, when a large threshold adjustment $V_{TH}$ is applied to the LA 100, and more particularly to the amplification circuit 102, a large offset will also be applied at the input to the Miller loop in LPF 104, which may cause the Miller amplifier to operate in a non-linear region and, hence, reduce the capacitance amplification. Furthermore, if LA 100 has a large intrinsic DC offset to begin with (e.g., due to device or component mismatches as described above), the offset applied to the input of the Miller loop in LPF 104 may again be of sufficient amplitude to cause the Miller amplifier to operate in its non-linear region regardless of the threshold adjustment applied to the LA. In either case, any offset present in the LA—whether intrinsic or caused by an applied threshold-adjustment—is amplified by the large total LA gain, typically, for example, from 20 to 30 decibels (dB), and subsequently appears at the input of LPF 104, negating the advantage of the Miller amplifier.

Figure 3:
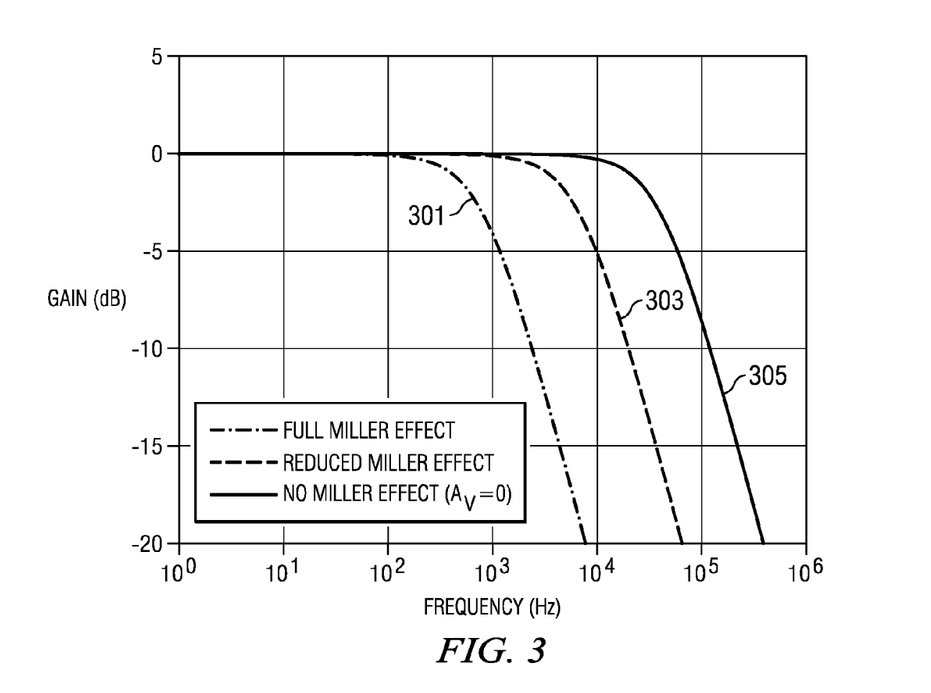
FIG. 3 illustrates a plot showing the frequency response of an example low-pass filter.

FIG. 3 illustrates a simulated frequency response of an example low-pass filter suitable for use as LPF 104 and that includes a Miller loop. As shown in FIG. 3, when the Miller amplifier of the Miller loop is operating in its linear region, the capacitance amplification may be maximized and the frequency response of the low-pass filter may follow the curve 301. As the Miller amplifier begins to saturate, the capacitance amplification is reduced and the frequency response of the low-pass filter may follow the curve 303. Lastly, when the Miller amplifier is completely saturated (or non-active), the capacitance of the low-pass filter is not amplified and the frequency response of the low-pass filter may follow the curve 305.

Figure 4:
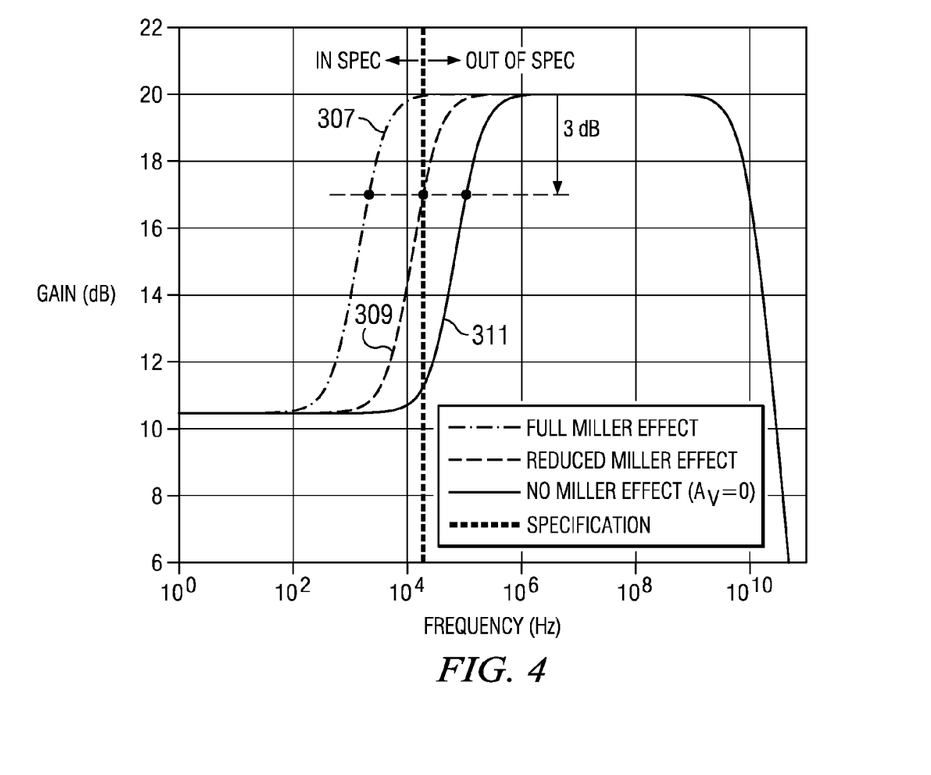
FIG. 4 illustrates a plot showing the frequency response of an example limiting amplifier circuit.

FIG. 4 illustrates a frequency response of an example LA circuit (e.g., LA 100) incorporating a low-pass filter (e.g., LPF 104) that includes a Miller amplifier. As shown in FIG. 4, when the Miller amplifier is operating in its linear region, the capacitance amplification may be maximized and the frequency response of the LA may follow the curve 307. As the Miller amplifier begins to saturate, the capacitance amplification is reduced and the frequency response of the LA may follow the curve 309. Lastly, when the Miller amplifier is completely saturated (or non-active), the capacitance of the low-pass filter is not amplified and the frequency response of the LA may follow the curve 311.

Figure 5:
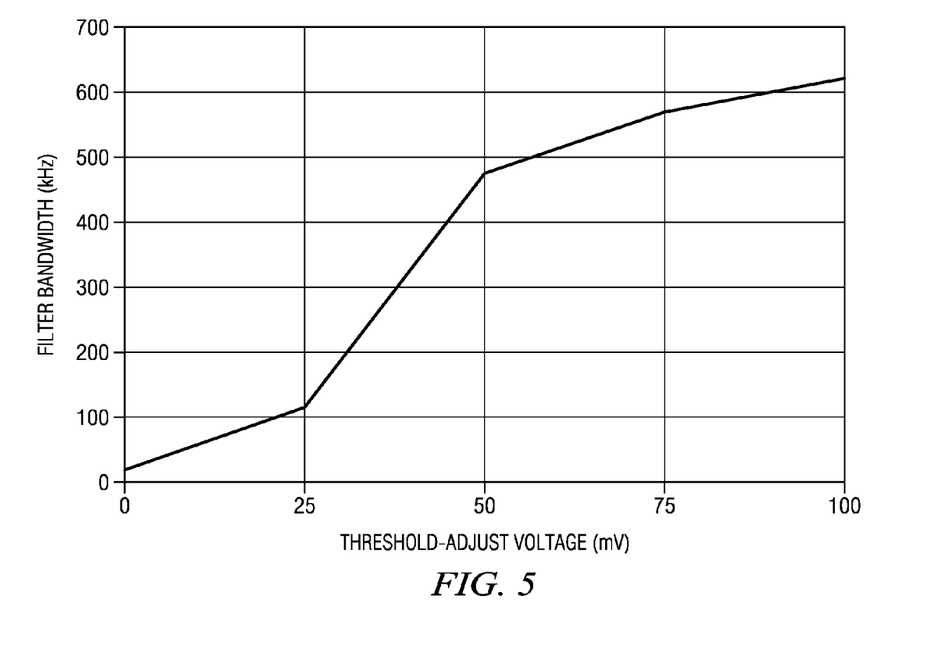
FIG. 5 illustrates a plot showing the bandwidth of an example low-pass filter as a function of an applied threshold-adjustment voltage.
Figure 6:
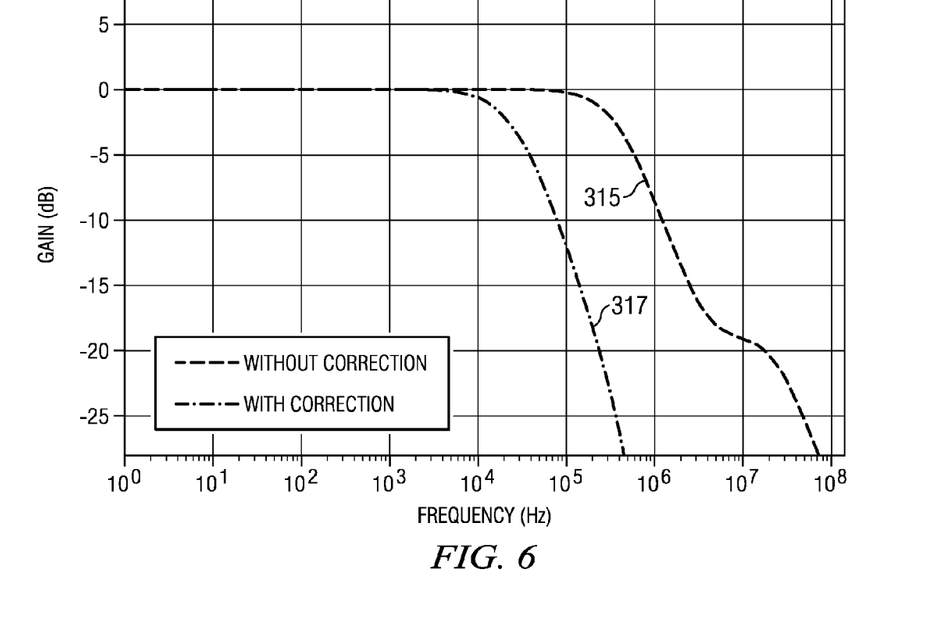
FIG. 6 illustrates two plots showing the frequency response of an example low-pass filter when a correction signal is applied to the filter and when no correction signal is applied, each in the presence of a threshold-adjustment signal applied to an example limiting amplifier circuit.

To further demonstrate the effect or importance of the Miller amplifier in compensating for a DC offset resulting from a threshold adjustment, FIG. 5 illustrates a plot showing the bandwidth of an example low-pass filter (e.g., LPF 104) as a function of an applied threshold-adjustment voltage $V_{TH}$. As shown, the bandwidth of the low-pass filter increases (which is undesirable) as the threshold-adjustment signal's magnitude is increased (Note that although the units of the x-axis in FIG. 5 are in Volts, or more specifically in milli-Volts (mV), this is only for didactic purposes as any suitable units may be used to reflect the digital nature of the threshold-adjustment signal (e.g., an eight-bit signal THADJ[7:0]) to illustrate the behavior of the bandwidth as a function of the threshold-adjustment signal). FIG. 6 illustrates the frequency response of an example low-pass filter (e.g., LPF 104) in response to an output signal produced by an example LA whose threshold level has been intentionally adjusted. When a Miller loop is used to amplify the capacitance, but the Miller amplifier transitions to its saturation region, the frequency response assumes the curve 315. However, when a correction current $I_{CORR}$ of opposite polarity as the threshold-adjustment current $I_{TH}$ is applied to maintain the linearity in the Miller loop, as described below with reference to FIGS. 9-11, the frequency response assumes the curve 317 as the correction current $I_{CORR}$ functions to restore the Miller amplification and thus, also the filter's bandwidth, in the presence of a threshold adjustment.

Figure 7:
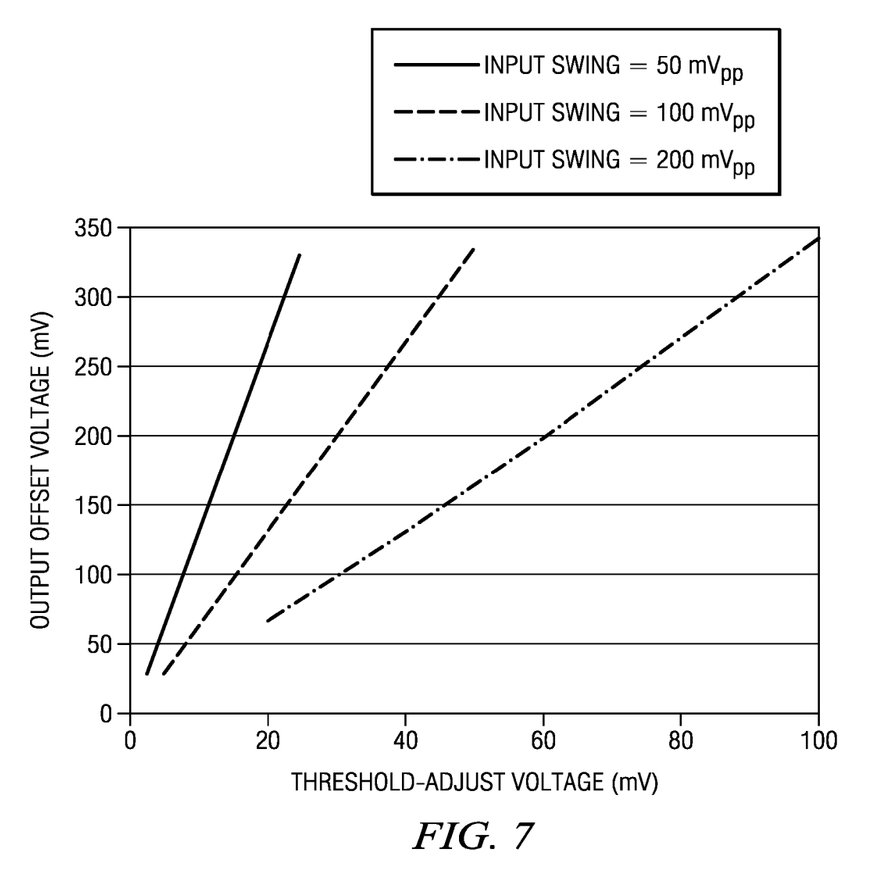
FIG. 7 illustrates a plot showing an output voltage offset of an example limiting amplifier circuit as a function of an applied threshold-adjustment voltage.

Furthermore, FIG. 7 illustrates a plot showing an output voltage offset of an example LA circuit as a function of an applied threshold-adjustment voltage. When a threshold adjustment is applied to the LA 100, or more particularly Amplification Circuit 102, an offset appears at the output of the LA, which is the input of the low-pass filter 104. The size of the offset depends on the input swing; that is, for a given threshold-adjustment magnitude, the smaller the input swing, the larger the offset. As the offset increases, the gain $A_V$ of the Miller amplifier will be reduced causing the filter's bandwidth to increase (which is undesirable).

Figure 8:
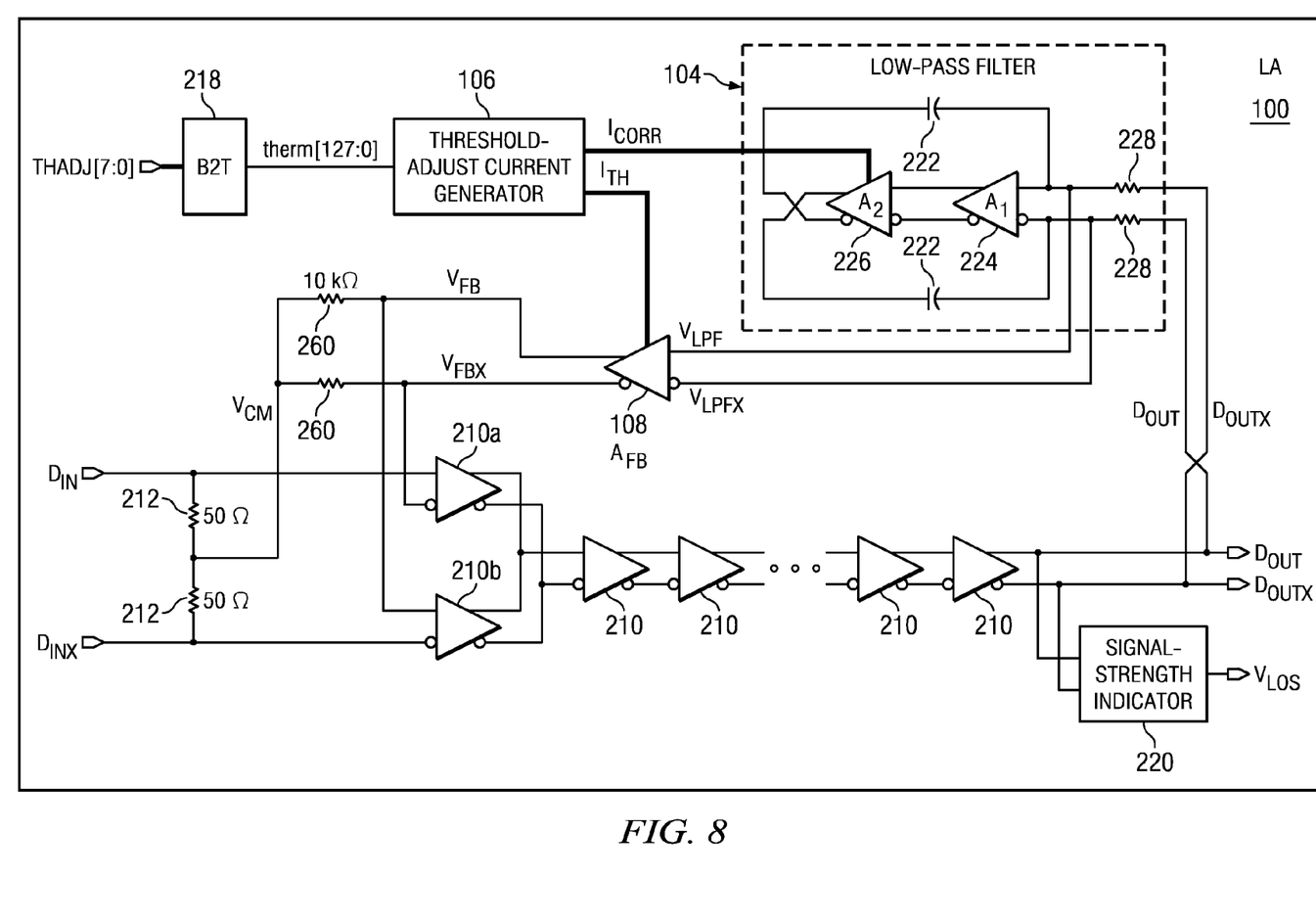
FIG. 8 illustrates a particular example implementation of the limiting amplifier circuit of FIG. 1.

FIG. 8 illustrates an example circuit embodiment of LA 100 that includes amplification circuit 102, LPF 104, threshold-adjust current generator 106, and $A_{FB}$ 108. In the illustrated embodiment, amplification circuit 102 includes eight current mode logic (CML) voltage gain stages 210, input-termination resistors 212, a binary-to-thermometer decoder 218, and a signal strength indicator circuit 220. In the illustrated embodiment, the first gain stage 210 is split into two differential stages 210a and 210b that receive various inputs including compensating signals $V_{FB}$ and $V_{FBX}$ output from $A_{FB}$ 108.

Figure 9:
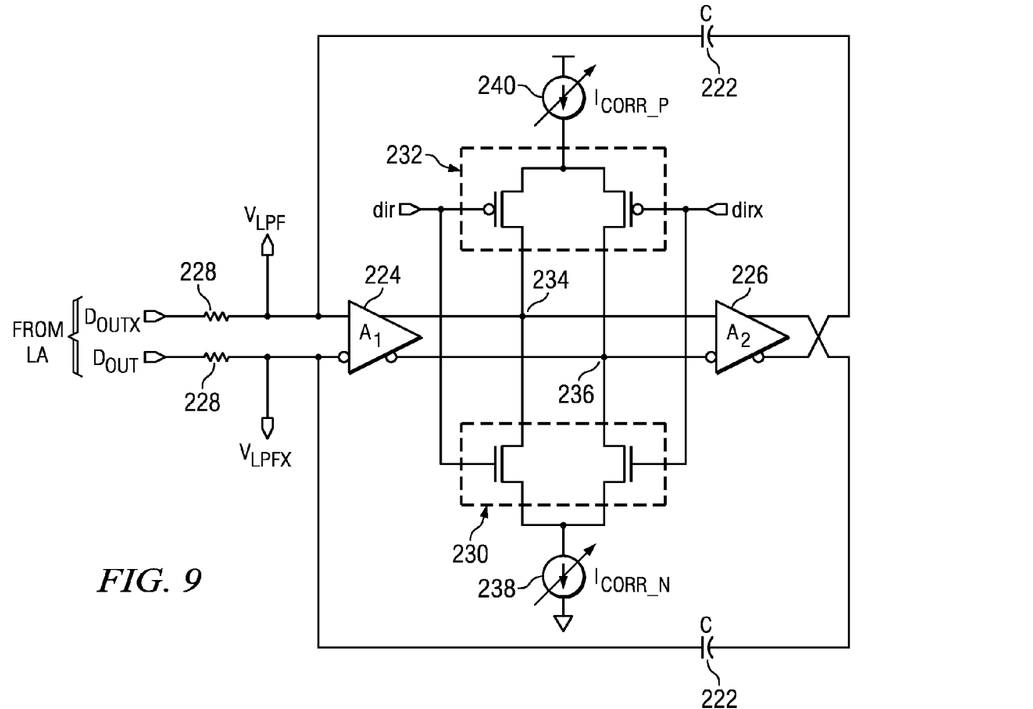
FIG. 9 illustrates an example low-pass filter.

FIG. 9 illustrates an example circuit embodiment of LPF 104. In particular embodiments, LPF 104 is a RC filter where the capacitors 222 are enclosed in a Miller feedback loop to amplify their effective capacitance. The capacitance seen at the input of the feedback loop is $C_{IN}=(1+A_V)C$, where $A_V$ is the total voltage gain of the Miller amplifier (i.e., those amplifiers enclosed in the Miller feedback loop), which, in the illustrated embodiment, is $A_1*A_2$ where $A_1$ and $A_2$ are the gains of the amplifiers 224 and 226, respectively (in one example, $A_1=A_2=16$ dB). Hence, the RC time constant of LPF 104 is $2\pi*R*(1+A_V)C$, where C is the capacitance of each of the capacitors 222 and R is the resistance of each of the resistors 228. In an example embodiment, the capacitors 222 are implemented using arrays of unit-sized P-poly capacitor fingers and the amplifiers 224 and 226 are resistively-loaded CML amplifiers. In an example embodiment, R=107 kiliohms (kΩ) and C=160 picofarads (pF).

In the illustrated embodiment, LPF 104 additionally includes nmos (n-type metal-oxide-semiconductor field effect transistor (MOSFET)) and pmos (p-type MOSFET) differential pairs 230 and 232, respectively, placed between the two gain stages 224 and 226. Differential pair 230 is biased by an nmos current source 238 and differential pair 232 is biased by a pmos current source 240. The magnitudes of current sources 238 and 240 are equal. In particular embodiments, the differential pairs 230 and 232 inject feedback compensation signals $I_{CORR\_N}$ and $I_{CORR\_P}$ (collectively referred to as "$I_{CORR}$") from current sources 238 and 240, respectively, each having the same magnitude but opposite polarity, where the magnitude is a function of the magnitude of the threshold-adjust current $I_{TH}$ injected into the feedback loop at $A_{FB}$ 108, and where the polarity by which $I_{CORR}$ is injected into the Miller loop of LPF 104 is opposite the polarity by which $I_{TH}$ is injected at $A_{FB}$ 108. Hence, if the applied threshold adjustment is positive, signal "dir" (as in "direction") is set to logical "1" and dirx is set to logical "0," and differential pair 230 will inject $I_{CORR\_N}$ from the nmos current source 238 into node 234 of the feedback loop, lowering the voltage at node 234, and differential pair 232 will inject $I_{CORR\_P}$ from the pmos current source 240 into node 236, raising the voltage at node 236; while if the applied threshold adjustment is negative, signal "dir" is set to logical "0" and dirx is set to logical "1," and differential pair 230 will inject $I_{CORR\_N}$ from the nmos current source 238 into node 236 of the feedback loop, lowering the voltage at node 236, and differential pair 232 will inject $I_{CORR\_P}$ from the pmos current source 240 into node 234, raising the voltage at node 234, as shown in FIG. 9. As long as the loop remains linear (i.e., the Miller amplifiers 224 and 226 are operating in their linear regions), the effective capacitance is increased to $(1+A_V)C$. If amplification circuit 102 has a large intrinsic offset (e.g., caused by device or component mismatches) or a large threshold-level adjustment, a potentially large DC voltage offset will appear at the input of the loop; that is, between $D_{OUTX}$ and $D_{OUT}$. This DC offset would be amplified by amplifiers 224 and 226 causing the Miller loop to saturate and reducing the Miller amplification of the effective capacitance.

Hence, the differential pairs 230 and 232, having gate voltages dir and dirx (the complement of dir) that are digital signals that control the polarity of the $I_{CORR}$ current injection, inject the currents $I_{CORR\_N}$ and $I_{CORR\_P}$ from the current sources 238 and 240, respectively, to prevent the loop (specifically the amplifiers 224 and 226) from saturating (i.e., moving into non-linear operating regions). That is, when the applied threshold adjustment is positive, dir is a logic high (and dirx is a logic low) and differential pair 230 pulls down the voltage at node 234 by injecting $I_{CORR\_N}$ of current source 238 into node 234 while differential pair 232 raises the voltage at node 236 by injecting $I_{CORR\_P}$ of current source 240 into node 236, and conversely, when the applied threshold adjustment is negative, dir is low (and dirx is high) and differential pair 232 raises the voltage at node 234 by injecting $I_{CORR\_P}$ of current source 240 into node 234 while differential pair 230 lowers the voltage at node 236 by injecting $I_{CORR\_N}$ of current source 238 into node 236. In this manner, the differential pairs 230 and 232 raise one of the nodes 234 or 236 while lowering the other one of the nodes, thus maintaining a constant common-mode voltage between amplifiers 224 and 226.

In the illustrated embodiment, the magnitudes of $I_{CORR\_N}$ and $I_{CORR\_P}$ are equal and the magnitudes of $I_{TH\_N}$ and $I_{TH\_P}$ are equal, and are determined by the threshold-adjust signal THADJ. In a particular embodiment, the threshold-adjust signal THADJ is an 8-bit control word whose most-significant bit controls the polarity of the threshold-level adjustment and whose least-significant seven bits control its magnitude; these bottom seven bits are converted by binary-to-thermometer decoder 218 to a 127-bit thermometer-coded word that is then fed to threshold-adjust current generator 106, which outputs the current signals $I_{TH}$ (i.e., $I_{TH\_N}$ and $I_{TH\_P}$, hereinafter also referred to collectively as $I_{TH}$) and $I_{CORR}$ (i.e., $I_{CORR\_N}$ and $I_{CORR\_P}$, hereinafter also referred to collectively as $I_{CORR}$) based on the 127-bit coded word received from binary-to-thermometer decoder 218. In one example embodiment, the magnitude of $I_{TH}$ is adjusted in 127 increments of 20 microamps (μA) (from 0 to 2.54 milliamps (mA)) based on THADJ, or more specifically, the 127-bit coded word received from binary-to-thermometer decoder 218 which is, in turn, based on the 7-bit control word from the bottom seven bits of THADJ. In one example embodiment, the magnitude of $I_{CORR}$ is incremented in 15 steps of 40 μA (from 0 to 600 μA) based on THADJ, or again more specifically, the 127-bit coded word received from binary-to-thermometer decoder 218 which is, in turn, based on the 7-bit control word from the bottom 7 bits of THADJ. More specifically, every 15$^{th}$ bit of the 127-bit control word enables or disables a 40-μA unit current source in the threshold-adjust current generator 106. Although, in the described embodiment, the magnitude of the correction signal $I_{CORR}$ was made a fixed predetermined function (fraction) of the magnitude of the applied threshold-adjust signal $I_{TH}$, this function could have been made programmable, and hence, changed dynamically.

Figure 10:
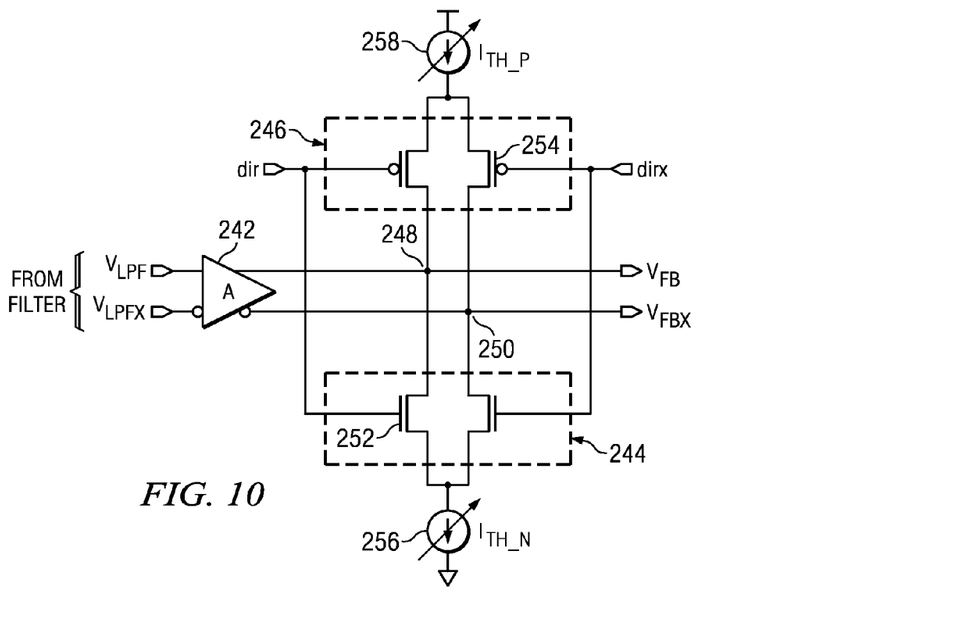
FIG. 10 illustrates an example feedback amplifier.

As described above, the injected currents $I_{CORR\_P}$ and $I_{CORR\_N}$ pull one of the nodes 234 or 236 low while the other one of the nodes is pulled high, thus maintaining the common-mode voltage $V_{CM}$ (e.g., at an unchanged voltage of 0.9 volts (V)), which is the termination voltage for the LA inputs, independent of the magnitude of $I_{TH}$. More specifically, in the embodiment illustrated in FIG. 8, the outputs of LPF 104, namely $V_{LPF}$ and $V_{LPFX}$ (the complement of $V_{LPF}$), are fed to the input of the feedback amplifier $A_{FB}$ 214, which, in an example embodiment, comprises a resistively-loaded CML amplifier and includes also a similar differential pair structure as the differential pair structure of LPF 104 shown in FIG. 9. FIG. 10 illustrates an example embodiment of $A_{FB}$ 108. In the illustrated embodiment, $A_{FB}$ 108 includes a CML amplifier 242 whose constituent transistors were drawn with large gate lengths to minimize the effect of variations in their dimensions or doping characteristics. More particularly, $A_{FB}$ 108 includes an nmos differential pair 244 with nmos current source 256 and a pmos differential pair 246 with pmos current source 258 that together either raise or lower the voltages at nodes 248 and 250, namely $V_{FB}$ and $V_{FBX}$, based on the gate voltages dir and dirx (the same gate voltages applied to differential pairs 230 and 232) by injecting the threshold-level adjustment currents $I_{TH\_P}$ and $I_{TH\_N}$ to maintain the common-mode voltage $V_{CM}$. In the illustrated embodiment, the common-mode voltage $V_{CM}$ is sensed using two resistors 260, which, in one example, each have a resistance of 10 kΩ.

The common-mode voltage $V_{CM}$ and the DC voltage signals $V_{FB}$ and $V_{FBX}$ are then fed back to the LA input as illustrated in FIG. 8. In particular, the DC voltage signals $V_{FB}$ and $V_{FBX}$ are the signals against which the LA inputs are compared in the first stage (comprising stages 210a and 210b) of the amplification circuit 102. It should be noted that, in contrast to the common-mode voltage $V_{CM}$, the magnitudes of the DC voltage signals $V_{FB}$ and $V_{FBX}$ do depend on the magnitude of $I_{TH}$. For example, if dir is a logic high and dirx is a logic low, the left nmos transistor 252 in differential pair 242 will steer the current $I_{TH\_N}$ from current source 256 to node 248 thereby lowering $V_{FB}$ while the right pmos transistor 254 in differential pair 244 will steer the current $I_{TH\_P}$ from current source 258 to node 250 thereby raising $V_{FBX}$. However, again, the common-mode voltage $V_{CM}$ will remain unchanged, meaning that the LA inputs will be terminated at the desired $V_{CM}$ voltage level independent of the applied threshold-adjustment.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A method comprising:
    receiving, at a filter comprising a Miller amplifier, a differential data signal output by a limiting amplifier (LA), the differential data signal comprising an output direct current (DC) offset resulting at least in part from a threshold-adjustment signal applied to the LA or an intrinsic DC offset caused by one or more physical characteristics of the LA;
    generating a compensation signal based on the threshold-adjustment signal, a polarity of the compensation signal being opposite a polarity of the threshold-adjustment signal or the DC offset, a magnitude of the compensation signal being a function of the magnitude of the threshold-adjustment signal; and
    introducing the compensation signal to an internal node of the Miller amplifier to compensate for the DC offset to keep one or more amplifier stages of the Miller amplifier in their linear operating regions.

2. The method of claim 1, further comprising sensing the output DC offset by the filter and communicating the sensed output DC offset from the filter to an input stage of the LA in negative feedback to cancel the output DC offset.

3. The method of claim 1, wherein one or more of the physical characteristics of the LA causing the intrinsic DC offset comprise one or more dimensions or doping characteristics of one or more transistors in the LA.

4. The method of claim 1, wherein the magnitude of the compensation signal is a predetermined fraction of the magnitude of the threshold-adjustment signal.

5. The method of claim 1, wherein the threshold-adjustment signal effects a slice level of the LA.

6. The method of claim 1, wherein:
    the filter is a low-pass filter;
    the Miller amplifier amplifies the capacitance of the filter by a factor of $1+A_V$; and
    $A_V$ is the open-loop gain of the Miller amplifier.

7. The method of claim 1, wherein the Miller amplifier comprises:
    a first amplifier stage;
    a second amplifier stage;
    an nmos differential pair between the first and second amplifier stages; and
    a pmos differential pair between the first and second amplifier stages.

8. The method of claim 7, wherein:
    when the polarity of the threshold-adjustment signal is positive, the polarity of the generated compensation signal is negative and a voltage of the internal node is lowered; and
    when the polarity of the threshold-adjustment signal is negative, the polarity of the generated compensation signal is positive and a voltage of the internal node is raised.

9. The method of claim 8, wherein:
    the method further comprises generating a complement compensation signal having an equal magnitude as the compensation signal and a polarity opposite that of the polarity of the compensation signal;
    the Miller amplifier comprises a first internal node and a second internal node; and
    the internal node of the first and second internal nodes into which the compensation signal is introduced depends on the polarity of the threshold-adjustment signal.

10. The method of claim 9, wherein:
    when the polarity of the threshold-adjustment signal is positive,
        the polarity of the generated compensation signal is negative and a voltage of the first internal node is lowered; and
        the polarity of the generated complement compensation signal is positive and a voltage of the second internal node is raised; and
    when the polarity of the threshold-adjustment signal is negative,
        the polarity of the generated compensation signal is positive and a voltage of the first internal node is raised; and
        the polarity of the generated complement compensation signal is negative and a voltage of the second internal node is lowered.

11. A circuit comprising:
    a filter comprising a Miller amplifier and configured to receive a differential data signal output by a limiting amplifier (LA), the differential data signal comprising an output direct current (DC) offset resulting at least in part from a threshold-adjustment signal applied to the LA or an intrinsic DC offset caused by one or more physical characteristics of the LA;
    a current generator configured to generate a compensation signal based on the threshold-adjustment signal, a polarity of the compensation signal being opposite a polarity of the threshold-adjustment signal or the DC offset, a magnitude of the compensation signal being a function of the magnitude of the threshold-adjustment signal; and
    wherein the compensation signal is introduced to an internal node of the Miller amplifier to compensate for the DC offset to keep one or more amplifier stages of the Miller amplifier in their linear operating regions.

12. The circuit of claim 11, wherein the filter is configured to sense the output DC offset and communicate the sensed output DC offset to an input stage of the LA in negative feedback to cancel the output DC offset.

13. The circuit of claim 11, wherein one or more of the physical characteristics of the LA causing the intrinsic DC offset comprise one or more dimensions or doping characteristics of one or more transistors in the LA.

14. The circuit of claim 11, wherein the magnitude of the compensation signal is a predetermined fraction of the magnitude of the threshold-adjustment signal.

15. The circuit of claim 11, wherein the threshold-adjustment signal effects a slice level of the LA.

16. The circuit of claim 11, wherein:
the filter is a low-pass filter;
the Miller amplifier amplifies the capacitance of the filter by a factor of $1+A_V$; and
$A_V$ is the open-loop gain of the Miller amplifier.

17. The circuit of claim 11, wherein the Miller amplifier comprises:
a first amplifier stage;
a second amplifier stage;
an nmos differential pair between the first and second amplifier stages; and
a pmos differential pair between the first and second amplifier stages.

18. The circuit of claim 17, wherein:
when the polarity of the threshold-adjustment signal is positive, the current generator generates a compensation signal having a negative polarity that lowers a voltage of the internal node; and
when the polarity of the threshold-adjustment signal is negative, the current generator generates a compensation signal having a positive polarity that raises a voltage of the internal node.

19. The circuit of claim 18, wherein:
the current generator is further configured to generate a complement compensation signal having an equal magnitude as the compensation signal and a polarity opposite that of the polarity of the compensation signal;
the Miller amplifier comprises a first internal node and a second internal node; and
the internal node of the first and second internal nodes into which the compensation signal is introduced depends on the polarity of the threshold-adjustment signal.

20. The circuit of claim 19, wherein:
when the polarity of the threshold-adjustment signal is positive,
the polarity of the generated compensation signal is negative and a voltage of the first internal node is lowered; and
the polarity of the generated complement compensation signal is positive and a voltage of the second internal node is raised; and
when the polarity of the threshold-adjustment signal is negative,
the polarity of the generated compensation signal is positive and a voltage of the first internal node is raised; and
the polarity of the generated complement compensation signal is negative and a voltage of the second internal node is lowered.

\* \* \* \* \*